US006788100B2

(12) United States Patent
Fiedler

(10) Patent No.: US 6,788,100 B2
(45) Date of Patent: Sep. 7, 2004

(54) RESISTOR MIRROR

(75) Inventor: Alan Fiedler, Bloomington, MN (US)

(73) Assignee: Blueheron Semiconductor Corporation, Bloomington, MN (US)

( * ) Notice: Subject to any disclaimer, the term of this patent is extended or adjusted under 35 U.S.C. 154(b) by 0 days.

(21) Appl. No.: 10/355,611

(22) Filed: Jan. 31, 2003

(65) Prior Publication Data

US 2004/0150420 A1 Aug. 5, 2004

(51) Int. Cl.[7] ........................ H03K 17/16; H03K 19/003

(52) U.S. Cl. .............................. 326/30; 326/86; 326/90

(58) Field of Search .............................. 326/30, 86, 90; 327/108, 538

(56) References Cited

U.S. PATENT DOCUMENTS

| | | | | |
|---|---|---|---|---|
| 5,134,311 A | * | 7/1992 | Biber et al. | 327/108 |
| 6,087,847 A | * | 7/2000 | Mooney et al. | 326/30 |
| 6,181,157 B1 | | 1/2001 | Fiedler | 326/30 |
| 6,710,618 B1 | * | 3/2004 | Murray | 326/30 |
| 2003/0141923 A1 | * | 7/2003 | Liu et al. | 327/538 |

OTHER PUBLICATIONS

Xilinx, "Virtex–II 1.5V Field–Programmable Gate Arrays," Advance Project Specification, DS031–2 (v2.0) Jul. 16, 2002.

* cited by examiner

*Primary Examiner*—Michael Tokar
*Assistant Examiner*—Khai Nguyen
(74) *Attorney, Agent, or Firm*—Fulbright & Jaworski LLP

(57) ABSTRACT

A resistor mirror which biases transistors substantially in their linear region of operation and in such a way that their combined parallel resistance is equal to the resistance of a reference resistor. The resistor mirror may include three or more offset control circuits, a feedback control circuit with a reference resistor, a reference voltage-controlled resistor, and one or more additional voltage-controlled resistors. The offset control circuit includes two voltage-controlled current sources. Three or more offset control circuits are connected in a manner so as to affect an equal number of resistor control output terminals coupled to the reference voltage-controlled resistor and to the additional voltage-controlled resistors. To minimize signal coupling between multiple voltage-controlled resistors coupled to the same resistor control output terminals, and to insure stability in the circuit's operating point, a filter capacitor is coupled to each resistor control output terminal. Additionally, through transistor scaling, the resistance of any voltage-controlled resistor may be a multiple or fraction of the reference resistor.

16 Claims, 7 Drawing Sheets

Resistor Mirror

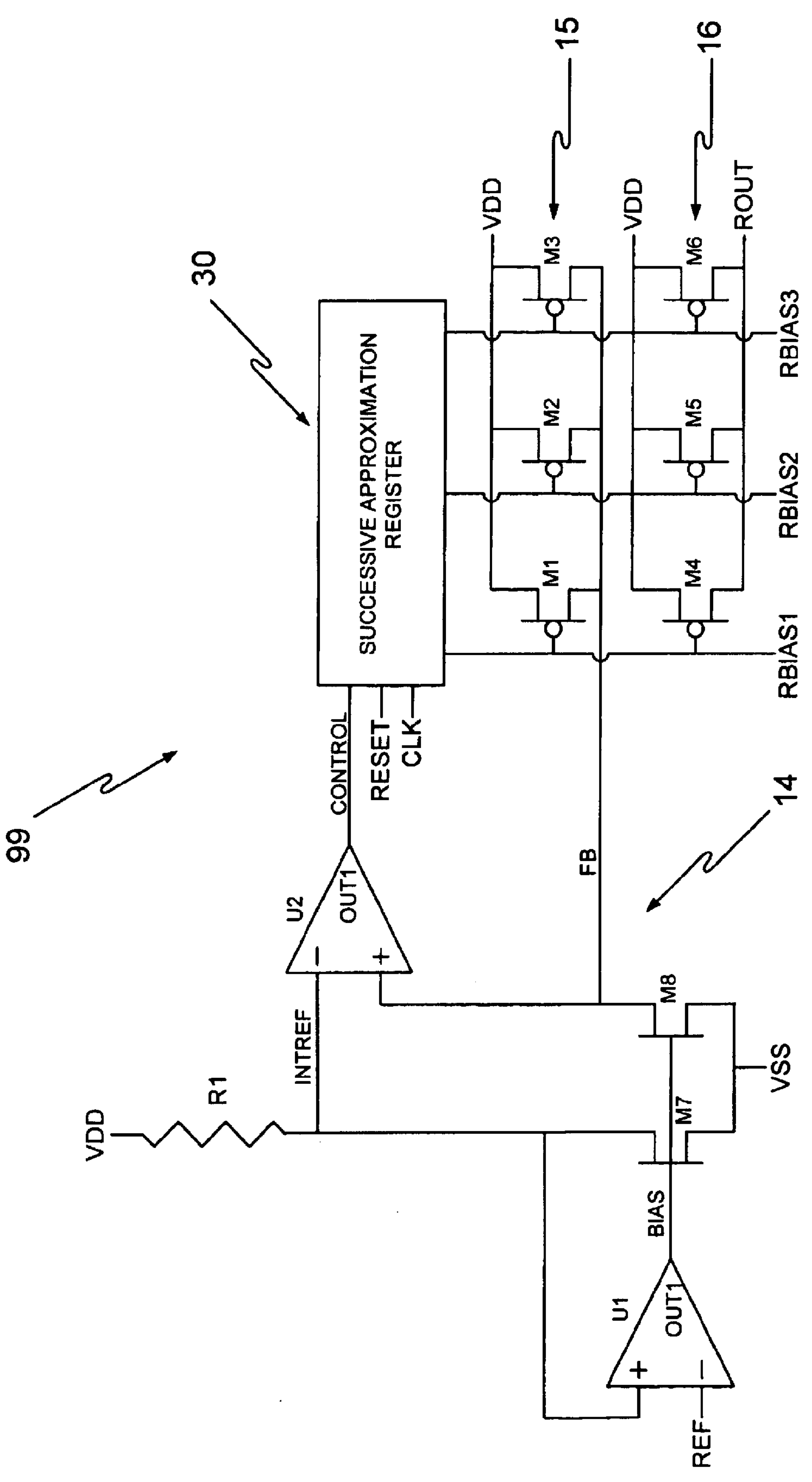
Fig. 1: Prior-Art Resistor Mirror

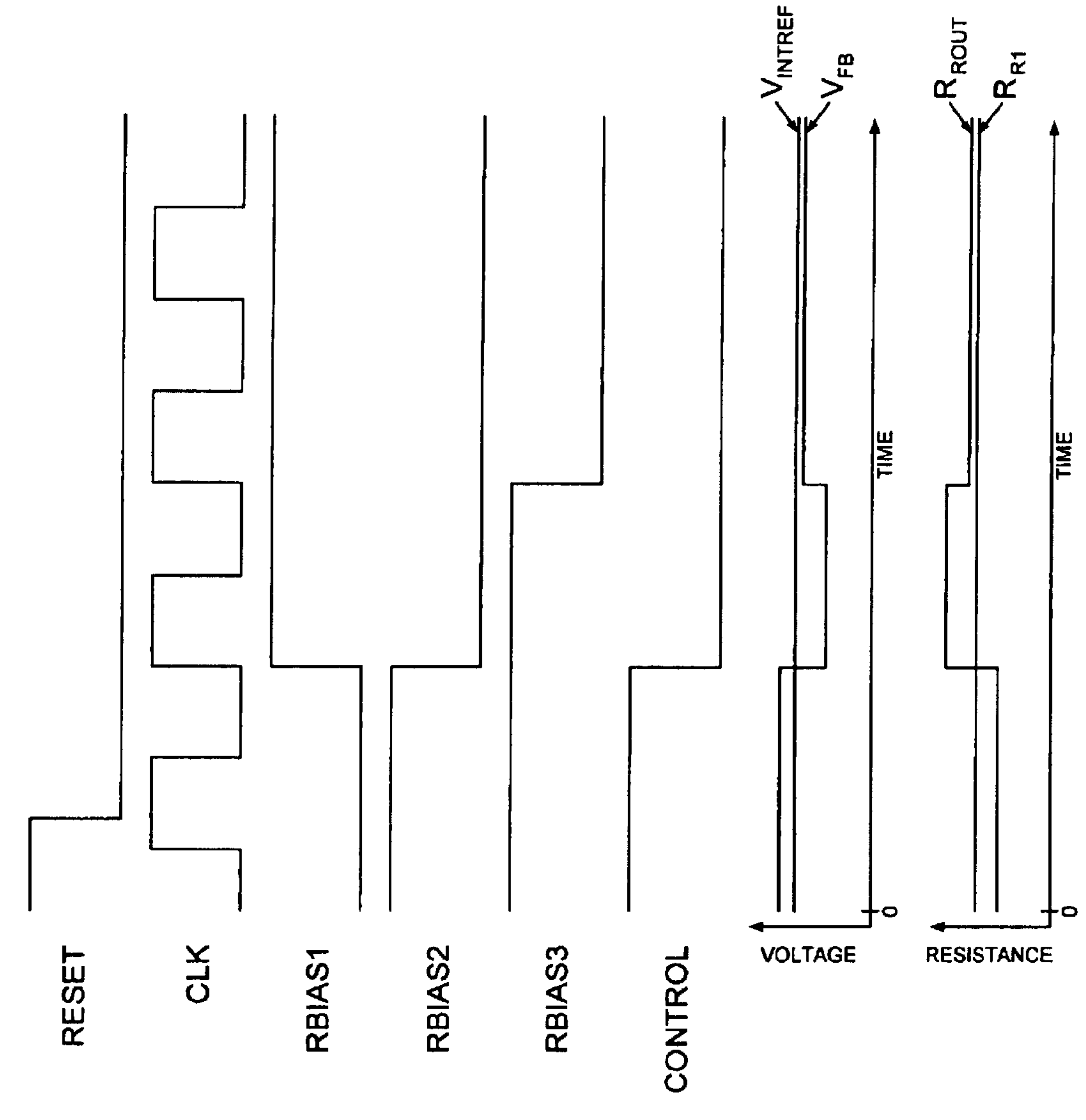
Fig. 2: Signals During Operation of Prior-Art Resistor Mirror

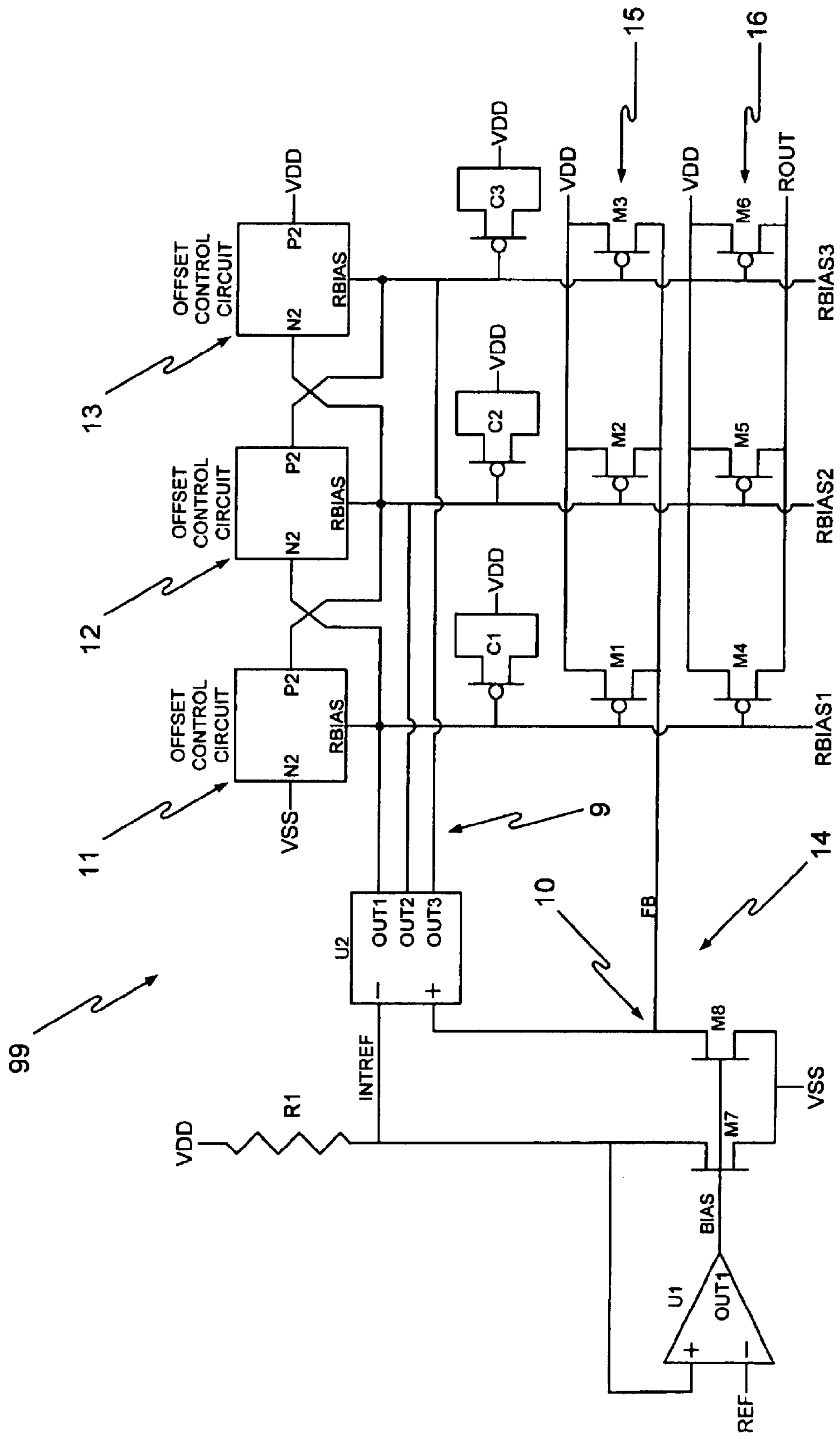
Fig. 3: Resistor Mirror

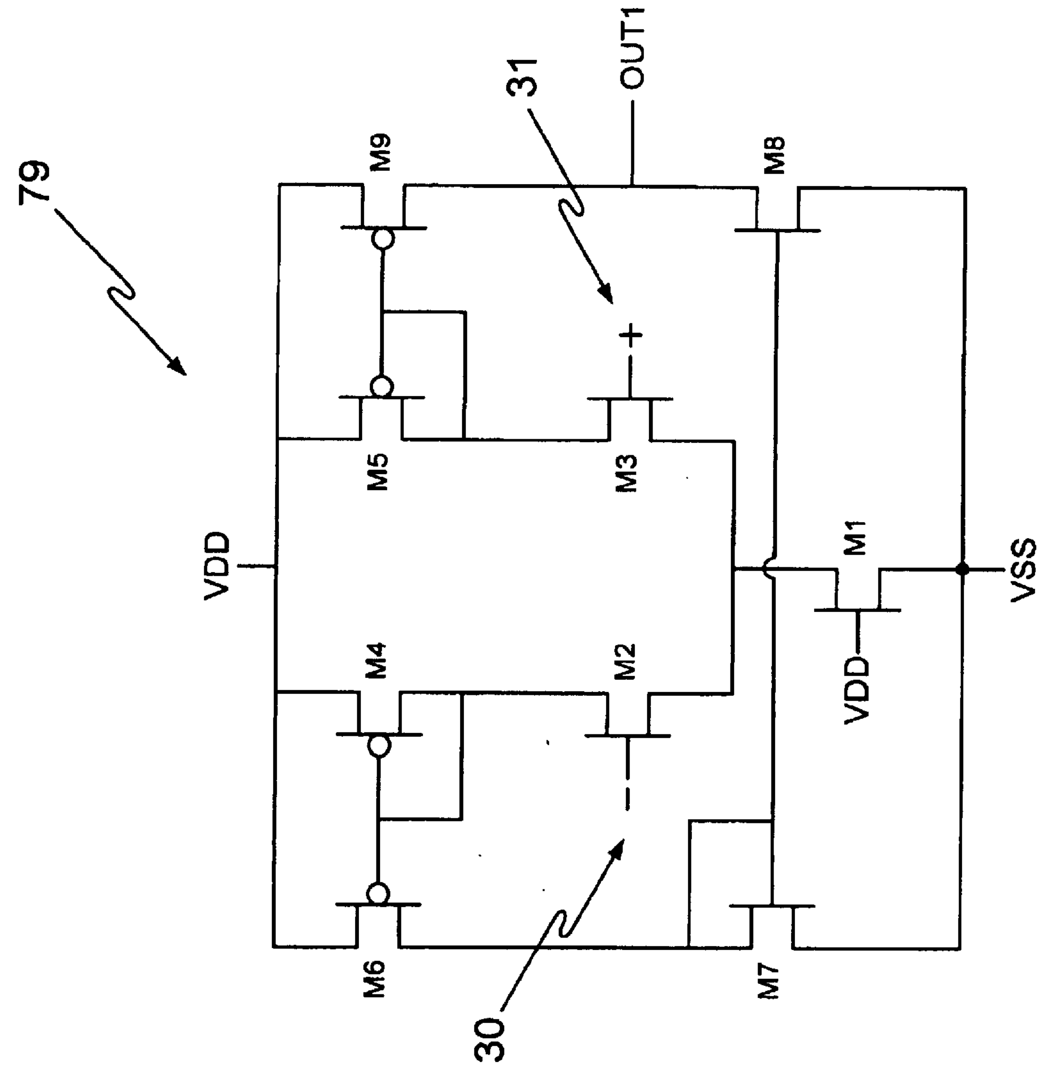
Fig. 4: Differential-to-single-ended Amplifier

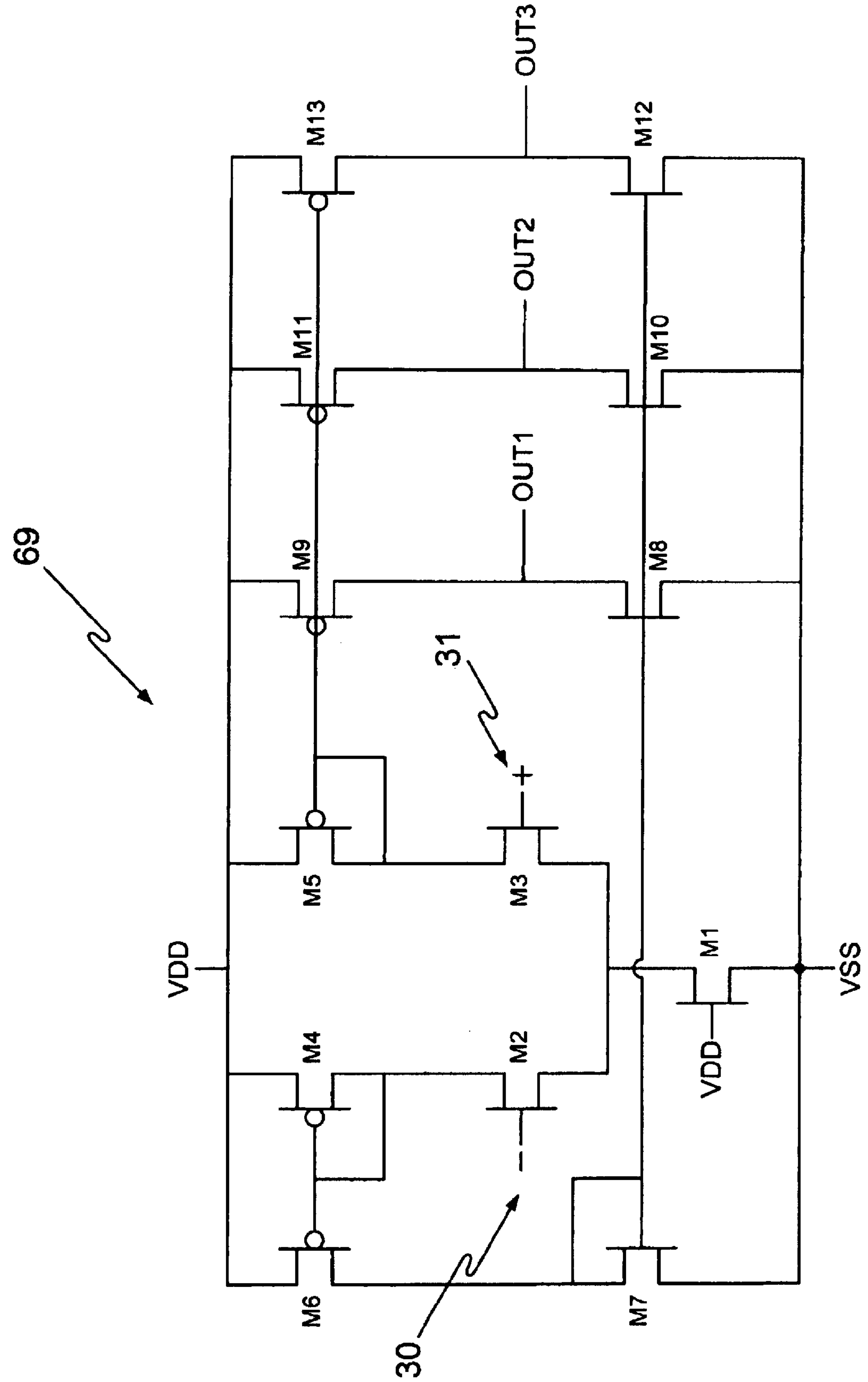
Fig. 5: Multi-output Differential-to-single-ended Amplifier

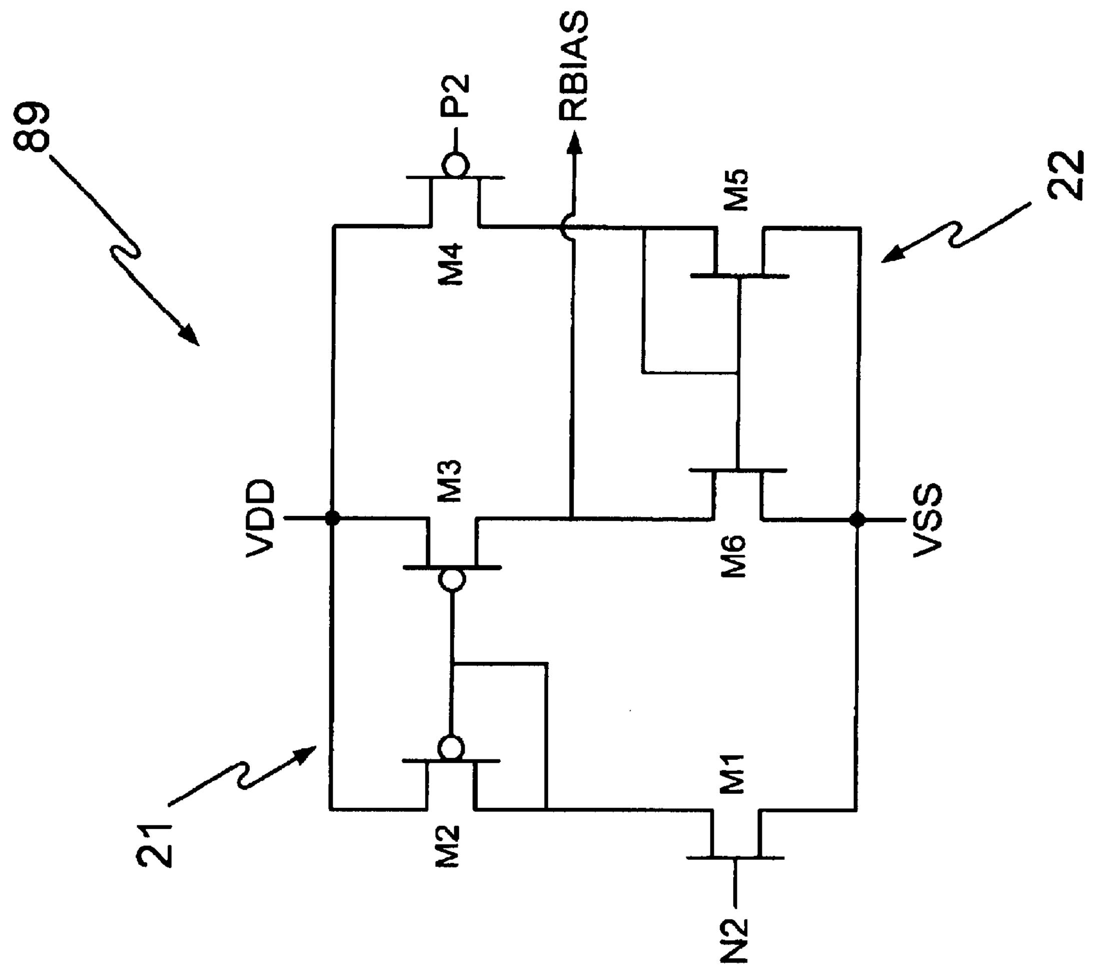
Fig. 6: Offset Control Circuit

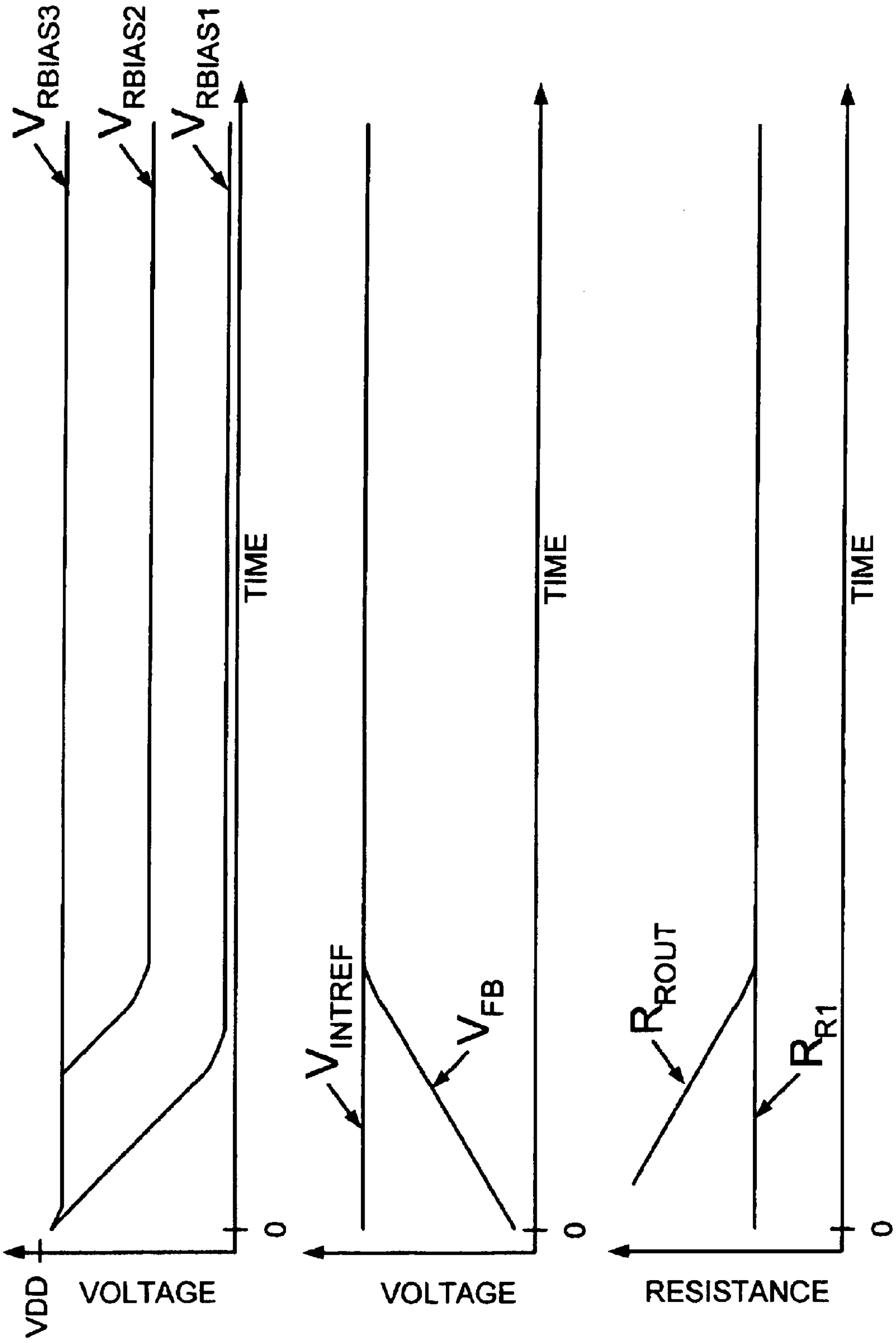
Fig. 7: Signals During Operation of Resistor Mirror

RESISTOR MIRROR

BACKGROUND OF THE INVENTION

This invention relates to semiconductor integrated circuits and, more particularly, to a resistor mirror. A resistor mirror is defined herein as a circuit which measures the resistance of an input device and, based on that measurement, induces one or more output devices to each exhibit a substantially similar resistance (or, through fixed or programmable scaling, a multiple or fraction of the resistance of the first device). This resistive output device is particularly suited for use within an integrated circuit as a transmission line termination, an amplifier load, or the resistive component in a filter. Its scalability, programmability, and ability to track a stable, external reference resistor in the presence of temperature and process variation make this resistor mirror particularly versatile. FIG. 1 is a schematic diagram illustrating a resistor mirror 99 of the prior art. Resistor mirror 99 includes successive approximation register (SAR) 30, feedback control circuit 14, reference voltage-controlled resistor 15, and a second voltage-controlled resistor 16 coupled to resistor mirror output ROUT.

SAR 30 is coupled to input terminals RESET and CLK, internal node CONTROL, and resistor control output terminals RBIAS1, RBIAS2, and RBIAS3. Feedback control circuit 14 includes a control input terminal coupled to feedback node FB and a control output terminal coupled to CONTROL. Feedback control circuit 14 further includes reference resistor R1 coupled between supply terminal VDD and internal reference node INTREF; differential to single-ended amplifier U1 having a non-inverting input coupled to INTREF, an inverting input coupled to external reference voltage input REF, and an output coupled to bias node BIAS; n-channel transistor M7 having a drain coupled to INTREF, a gate coupled to BIAS, and a source coupled to supply terminal VSS; n-channel transistor M8 having a drain coupled to FB, a gate coupled to BIAS, and a source coupled to VSS; and comparator U2 having an inverting input coupled to INTREF, a non-inverting input coupled to FB, and an output coupled to CONTROL. In one embodiment, external reference voltage input REF is a constant voltage substantially equal to the expected minimum voltage at ROUT. Differential to single-ended amplifier U1 of FIG. 1 is used to bias transistors M7 and M8 such that each conducts a current substantially equal to $(VDD-V_{REF})/R_{R1}$.

Reference voltage-controlled resistor 15 includes p-channel transistor M1 with a drain coupled to FB, a source coupled to VDD, and a gate coupled to RBIAS1; p-channel transistor M2 with a drain coupled to FB, a source coupled to VDD, and a gate coupled to RBIAS2; and p-channel transistor M3 with a drain coupled to FB, a source coupled to VDD, and a gate coupled to RBIAS3.

A second voltage-controlled resistor 16 includes p-channel transistor M4 with a drain coupled to ROUT, a source coupled to VDD, and a gate coupled to RBIAS1; p-channel transistor M5 with a drain coupled to ROUT, a source coupled to VDD, and a gate coupled to RBIAS2; and p-channel transistor M6 with a drain coupled to ROUT, a source coupled to VDD, and a gate coupled to RBIAS3.

FIG. 2 shows operation of resistor mirror 99 of FIG. 1 using SAR 30 and an adjustment sequence to determine optimum logic levels for RBLASn (n=1,2,3) so as to most closely match the resistance of reference voltage-controlled resistor 15 to the resistance of R1. Controlled by RESET and CLK, SAR 30 is used to successively set or clear (assert to a logic high or logic low level) RBIASn (n=1,2,3), depending on the CONTROL logic level. The relative resistance of the voltage-controlled resistor 15 and of R1 is determined by conducting substantially equal currents through each (by means of equal-sized and similarly-biased n-channel transistors M7 and M8) and comparing the resulting voltages INTREF and FB using comparator U2. At time 0 in FIG. 2, RESET is asserted high, SAR 30 resets RBIAS1 low and also sets RBIAS2 and RBIAS3 high, and in response $V_{FB}>V_{INTREF}$, and feedback control circuit 14 forces CONTROL to a logic high level, indicating that the resistance of reference voltage-controlled resistor 15 is less than that of reference resistor R1.

On the first rising edge of CLK subsequent to the falling edge of RESET, SAR 30 resets RBIAS2 to a logic low level, and the logic high level on CONTROL causes SAR 30 to also set RBIAS1 to a logic high level. In response to this change in RBIASn (n=1,2,3) levels, now $V_{FB}<V_{INTREF}$, and CONTROL falls to a logic low level, indicating that the resistance of reference voltage-controlled resistor 15 is now greater than that of resistor resistor R1.

On the second rising edge of CLK subsequent to the falling edge of RESET, SAR 30 resets RBIAS3 to a logic low level, and the logic low level on CONTROL causes SAR 30 to also keep RBIAS2 at a logic low level. In response to these RBLASn (n=1,2,3) levels, CONTROL remains at a logic low level, indicating that the resistance of reference voltage-controlled resistor 15 remains greater than that of reference resistor R1.

On the third rising edge of CLK subsequent to the falling edge of RESET, the logic low level on CONTROL causes SAR 30 to keep RBIAS3 at a logic low level. At this point, the resistance of reference voltage-controlled resistor 15, and by extension, the resistance of the second voltage-controlled resistor 16, has been adjusted to approximately match that of R1.

This prior art resistor mirror has several significant drawbacks. First, because digital logic levels are used to control each p-channel transistor making up the voltage-controlled resistors, there is no way to partially turn on the transistors. This digital method of controlling the p-channel transistors can result in a significant quantization error, as the smallest resistance adjustment which can be made is that achieved by switching on or off the last p-channel transistor, controlled by RBIAS3. Second, once the sequence illustrated in FIG. 2 is complete, the circuit is unable to make any correction in the resistance of the voltage-controlled resistor in the event of a change in temperature or operating condition without repeating the entire adjustment sequence. What is needed is a method which does not suffer from quantization error and also allows for adjustment of the resistance of the voltage-controlled resistor in the event of a change in temperature or operating condition.

SUMMARY OF THE INVENTION

The resistor mirror of the present invention includes a feedback control circuit coupled to three or more resistor control output terminals; three or more offset control circuits, each coupled to a resistor control output terminal; a reference voltage-controlled resistor coupled to the resistor control output terminals and to the feedback circuit; and one or more additional voltage-controlled resistors, each coupled to the resistor control output terminals. By means of negative feedback and the described behavior of the offset control circuit, the resistance of the reference voltage-controlled resistor is adjusted to approximate that of a reference resistor or other input device. Coupled to the same resistor control output terminals, the resistance of the additional voltage-controlled resistors will also approximate the resistance of the reference resistor. Through appropriate transistor dimension scaling, the resistance of the one or more additional voltage-controlled resistors may be set to a fixed fraction or multiple of the reference resistor.

BRIEF DESCRIPTION OF THE DRAWINGS

FIG. 1 is a schematic diagram of a prior-art resistor mirror.

FIG. 2 shows waveforms of the prior-art resistor mirror signals as well as resistance value, illustrating circuit operation.

FIG. 3 is a schematic diagram of a resistor mirror, in accordance with the present invention.

FIG. 4 is a schematic diagram of a differential to single-ended amplifier used in the feedback control circuit.

FIG. 5 is a schematic diagram of a multi-output differential to single-ended amplifier used in the feedback control circuit.

FIG. 6 is a schematic diagram of an offset control circuit.

FIG. 7 shows waveforms of the resistor mirror control signals as well as resistance value, illustrating circuit operation from an initial state with all resistor control signals high and ending at a final steady state, in accordance with the present invention.

DETAILED DESCRIPTION OF THE PREFERRED EMBODIMENTS

FIG. 3 is a schematic diagram of one embodiment of a resistor mirror in accordance with the present invention. Resistor mirror 99 includes feedback control circuit 14 coupled to resistor control output terminals RBIAS1, RBIAS2, and RBIAS3; offset control circuits 11, 12, and 13; loop filter capacitors C1, C2, and C3; reference voltage-controlled resistor circuit 15; and a second voltage-controlled resistor circuit 16 coupled to resistor mirror output ROUT. Contributing to the unique functionality of resistor mirror 99, offset control circuits 11, 12, and 13 are interconnected with each other as well as with other circuit elements. Note that those skilled in the art will find it a simple matter to extend the ideas presented here to design a resistor mirror including more than three resistor control output terminals and an array and interconnection of more than three offset control circuits, and FIG. 3 is intended as an exemplary embodiment of a resistor mirror with three resistor control output terminals and using three offset control circuits.

Feedback control circuit 14 includes an input 10 coupled to feedback node FB and a plurality of outputs 9 coupled to RBIAS1, RBIAS2, and RBIAS3. Feedback control circuit 14 further includes reference resistor R1 coupled between VDD and internal reference node INTREF; differential to single-ended amplifier U1 having a non-inverting input coupled to INTREF, an inverting input coupled to external reference voltage input REF, and an output coupled to bias node BIAS; n-channel transistor M7 having a drain coupled to INTREF, a gate coupled to BIAS, and a source coupled to VSS; n-channel transistor M8 having a drain coupled to FB, a gate coupled to BIAS, and a source coupled to VSS; and multi-output differential to single-ended amplifier U2 having an inverting input coupled to INTREF, a non-inverting input coupled to FB, and a plurality of outputs coupled to RBIAS1, RBIAS2, and RBIAS3. In one embodiment, external reference voltage input REF is a constant voltage substantially equal to the expected minimum voltage at ROUT. Differential to single-ended amplifier U1 of FIG. 3 is used to bias transistors M7 and M8 such that at steady state each conducts a current substantially equal to $(VDD-V_{REF})/R_{R1}$.

Each offset control circuit 11, 12, and 13 is coupled to either two or three resistor control output terminals RBIAS1, RBIAS2, and RBIAS3. With regard to offset control circuit 11, output terminal RBIAS is coupled to RBIAS1, input terminal N2 is coupled to VSS, and input terminal P2 is coupled to RBIAS2. With regard to offset control circuit 12, output terminal RBIAS is coupled to RBIAS2, input terminal N2 is coupled to RBIAS1, and input terminal P2 is coupled to RBIAS3. With regard to offset control circuit 13, output terminal RBIAS is coupled to RBIAS3, input terminal N2 is coupled to RBIAS2, and input terminal P2 is coupled to VDD. Offset control circuits 11, 12, and 13 contribute to the unique behavior of RBIAS1, RBIAS2, and RBIAS3 such that, during normal operation, of those transistors in reference voltage controlled resistor 15 and second voltage controlled resistor 16 that are on, no more than one in each is operating in saturation ($V_{DS}<V_{GS}-V_T$). Since at most one transistor is operating in saturation, a substantial majority of those transistors that are on are operating in their linear region, and this gives rise to a substantially linear voltage vs. current response for voltage-controlled resistors 15 and 16, thereby approximating the behavior of ideal, linear resistors Reference voltage-controlled resistor 15 includes p-channel transistor M1 with a drain coupled to FB, a source coupled to VDD, and a gate coupled to RBIAS1; p-channel transistor M2 with a drain coupled to FB, a source coupled to VDD, and a gate coupled to RBIAS2; and p-channel transistor M3 with a drain coupled to FB, a source coupled to VDD, and a gate coupled to RBIAS3.

Second voltage-controlled resistor 16 includes p-channel transistor M4 with a drain coupled to ROUT, a source coupled to VDD, and a gate coupled to RBIAS1; p-channel transistor M5 with a drain coupled to ROUT, a source coupled to VDD, and a gate coupled to RBIAS2; and p-channel transistor M6 with a drain coupled to ROUT, a source coupled to VDD, and a gate coupled to RBIAS3.

A schematic diagram of differential to single-ended amplifier U1 of FIG. 3 is shown in FIG. 4. Differential to single-ended amplifier 79 includes n-channel transistor M1 with a drain, a gate coupled to VDD, and a source coupled to VSS; n-channel transistor M2 with a drain, a gate coupled to inverting input terminal 30, and a source coupled to the drain of M1; n-channel transistor M3 with a drain, a gate coupled to non-inverting input terminal 31, and a source coupled to the drain of M1; diode-connected p-channel transistor M4 with a gate and a drain coupled to the drain of M2, and a source coupled to VDD; diode-connected p-channel transistor M5 with a gate and a drain coupled to the drain of M3, and a source coupled to VDD; p-channel transistor M6 with a drain, a gate coupled to the gate of M4, and a source coupled to VDD; diode-connected n-channel transistor M7 with a gate and a drain coupled to the drain of M6 and a source coupled to VSS; n-channel transistor M8 with a drain coupled to output terminal OUT1, a gate coupled to the gate of M7, and a source coupled to VSS; and n-channel transistor M9 with a drain coupled to OUT1, a gate coupled to the gate of MS, and a source coupled to VDD.

A schematic diagram of multi-output differential to single-ended amplifier U2 of FIG. 3 is shown in FIG. 5.

Multi-output differential to single-ended amplifier 69 includes all elements of differential to single-ended amplifier 79 of FIG. 4, and additionally includes output terminals OUT2 and OUT3; n-channel transistor M10 with a drain coupled to OUT2, a gate coupled to the gate of M7, and a source coupled to VSS; p-channel transistor M11 with a drain coupled to OUT2, a gate coupled to the gate of M5, and a source coupled to VDD; n-channel transistor M12 with a drain coupled to OUT3, a gate coupled to the gate of M7, and a source coupled to VSS; and p-channel transistor M13 with a drain coupled to OUT3, a gate coupled to the gate of M5, and a source coupled to VDD.

A schematic diagram of offset control circuit 11, 12, and 13 of FIG. 3 is shown in FIG. 6. Offset control circuit 89 includes input terminals N2 and P2, output terminal RBIAS, and voltage-controlled current sources 21 and 22. For control of a first current onto RBIAS, voltage-controlled current source 21 includes n-channel transistor M1 having a drain, a gate coupled to N2, and a source coupled to VSS; diode-connected p-channel transistor M2 having a gate and a drain coupled to the drain of M1, and a source coupled to VDD; and p-channel transistor M3 having a drain coupled to RBIAS, a gate coupled to the gate of M2, and a source coupled to VDD. For control of a second current onto RBIAS, voltage-controlled current source 22 includes p-channel transistor M4 having a drain, a gate coupled to P2, and a source coupled to VDD; diode-connected n-channel transistor M5 having a gate and a drain coupled to the drain of M4, and a source coupled to VSS; and n-channel transistor M6 having a drain coupled to RBIAS, a gate coupled to the gate of M5, and a source coupled to VSS.

The multi-output differential to single-ended amplifier U2 sources a current at each of its outputs proportional to the difference in voltage at its inputs, and each offset control circuit 11, 12, and 13 sources a current at its output as a function of the voltage at each of its inputs, N2 and P2. When $V_{N2}$ is greater than a threshold voltage of an n-channel FET ($V_{TN}$), the offset control circuit will source a positive current from its output, and this current is proportional to $(V_{N2}-V_{TN})^2$. When $V_{P2}$ is less than the threshold voltage of a p-channel FET plus VDD (i.e., when $V_{P2}<V_{TP}+VDD$, where $V_{TP}$ is normally a negative number), the offset control circuit will sink a positive current into its output, and this current is proportional to $(VDD-V_{P2}+V_{TP})^2$. The behavior of the combination of the multi-output differential to single-ended amplifier U2 and the three offset control circuits 11, 12, and 13 can be thought of as that of three differential to single-ended amplifiers each with input offset control.

By the manner in which the offset control circuits are interconnected, the stable operating point of a feedback loop (consisting of feedback control circuit 14, the three offset control circuits 11, 12, and 13, and reference voltage-controlled resistor 15) is described in part by the unique behavior of resistor control output terminals RBIAS1, RBIAS2, and RBIAS3, and this behavior is best described by way of example, illustrated in part in FIG. 7. Consider the example when resistor mirror 99 of FIG. 3 is in an initial state at time=0 with the voltage at RBIAS1 equal to the voltage at RBIAS2 equal to the voltage at RBIAS3 equal to VDD ($V_{RBIAS1}=V_{RBIAS2}=V_{RBIAS3}$=VDD), thus turning off transistors M1, M2, and M3. Also consider, for this example, that the transconductance of (and the current conducted by) transistors M7 and M8 are substantially equal. Given these stated conditions, U1 forces bias node BIAS to a voltage such that $V_{INTREF}=V_{REF}$, and M8 will then hold FB low at VSS. So at time=0, $V_{INTREF}>V_{FB}$, and in response for time>0, U2 begins to drive nodes RBIAS1, RBIAS2, and RBIAS3 low, in turn, from their initial high states. The order in which these nodes are driven low, or whether they are driven low at all, is affected by the voltages applied to the N2 and P2 inputs of each offset control circuit. RBIAS1 is the first resistor control output terminal driven low, since its N2 input is at VSS and its P2 input, coupled to RBIAS2, is at VDD, and offset control circuit 11 is not sourcing/sinking any current onto/from RBIAS1. At the same time, RBIAS2 is initially held high by offset control circuit 12 (since its N2 input, coupled to RBIAS1, is initially at VDD), and RBIAS3 is held high by offset control circuit 13 (since its N2 input, coupled to RBIAS2, is also initially at VDD). At the final stable operating point when $V_{INTREF}=V_{FB}$ (and, by extension, when the resistance of reference voltage-controlled resistor 15 equals the resistance of reference resistor R1), of the three voltages $V_{RBIASn}$ (n=1,2,3), only one will equal a voltage substantially different from VSS or VDD. At the stable operating point when $V_{INTREF}=V_{FB}$, in this example $V_{RBIAS2}$=VDD/2. Additionally, $V_{RBIAS1}$ is held near VSS by offset control circuit 11 because the voltage $V_{RBIAS2}$=VDD/2 is applied to its P2 input, thereby applying an excess of pull-down current on RBIAS1. Further, $V_{RBIAS3}$ is held near VDD because this same voltage $V_{RBIAS2}$=VDd/2 is applied to the N2 input of offset control circuit 13, thereby applying an excess of pull-up current on RBIAS3. Finally, by nature of the fact that $V_{RBIAS1}$=VSS and $V_{RBIAS3}$=VDD, no excess pull-up or pull-down current is applied to RBIAS2 by offset control circuit 12. Because of the described behavior and interconnection of offset control circuits 11, 12, and 13, of the three resistor control output terminals RBIASn (n=1,2,3), only one will be active (i.e., operating substantially between VSS and VDD), and all remaining RBIASn terminals will be held by operation of offset control circuits 11, 12, and 13 substantially near either VSS or VDD. The performance benefit of this behavior is that except for one, each of the transistors M1, M2, and M3 is operating either in its linear region (thereby behaving as a resistor, as desired) or is off. Of p-channel transistors M1, M2, and M3, only the one coupled to the active resistor control terminal RBIASn (n=1, 2, or 3) is possibly, but not necessarily, operating in saturation (i.e. with $V_{DS}<V_{GS}-V_{TP}$). By increasing the number of outputs in multi-output differential to single-ended amplifier U2 to greater than the three shown here (coupled with an equal increase in the number of instances of offset control circuits, the number of transistors comprising reference voltage-controlled resistor 15, and the number of transistors comprising second voltage-controlled resistor 16), the fraction of on transistors operating in saturation can be reduced, and those skilled in the art can readily extend the illustrated pattern of offset control circuit interconnection to achieve this. When this is done, the behavior of the reference voltage-controlled resistor 15 (and, by extension, the second voltage-controlled resistor 16) even more closely approximates that of a linear resistor.

As described, resistor mirror 99 provides for the resistance of both reference voltage-controlled resistor 15 and second voltage-controlled resistor 16 to substantially equal the resistance of a reference resistor R1. Those skilled in the art will readily observe that additional voltage-controlled resistors can be controlled by the same resistor control output terminals RBIASn (n=1,2,3) as these first two voltage-controlled resistors, and that by scaling their transistor sizes up or down, a resistance of a fixed fraction or multiple of the reference resistor resistance can also be obtained.

By reproducing the resistive behavior and value of a reference resistor with biased p-channel transistors, the present invention allows for the replacement with p-channel transistors of any resistor coupled to VDD anywhere within an integrated circuit. When this is done within a circuit which connects directly to package I/O, additional ESD (Electro-Static Discharge) protection due to the p-channel transistor's superior current-shunting capability, as compared to poly or diffusion resistors, is beneficially acquired.

Although the present invention has been described with reference to preferred embodiments, workers skilled in the art will recognize that changes may be made in form and detail without departing from the spirit and scope of the invention. Many of the components of the resistor mirror can be implemented with a variety of components and in a variety of configurations. The voltage-controlled resistors can be implemented with p-channel devices coupled to VDD (as described here) or to virtually any other terminal, or with n-channel devices coupled to VSS or to virtually any other terminal. Those skilled in the art will recognize the circuit changes to the feedback control circuit and elsewhere which would go in band with this change. For clarity, the foregoing specification describes the interconnection of exactly three offset control circuits 11, 12, and 13. Those skilled in the art will readily appreciate how to array and interconnect more than three offset control circuits to control more than three resistor control signals, and claim 1 should not be taken as limiting in this sense. The resistor mirror can be implemented with discreet components, with semiconductor devices embedded in an integrated circuit such as an application specific integrated circuit (ASIC), or with a combination of both. Except to the extent specified within the following claims, the circuit configurations shown herein are provided as examples only.

Individual signals or devices can be active high or low, and corresponding circuitry can be converted or complemented to suit any particular convention. The term "coupled" used in the specification and in the claims includes various types of connections or couplings and includes a direct connection or a connection through one or more intermediate components.

What is claimed is:

1. A resistor mirror for providing a resistance in proportion to that of a reference resistor, comprising:

first and second power supply terminals;

first, second, and third resistor control output terminals;

a feedback node;

a reference voltage-controlled resistor circuit coupled between the second power supply terminal and the feedback node and having first, second, and third control terminals respectively coupled to the first, second, and third resistor control output terminals;

a second voltage-controlled resistor circuit coupled between the second power supply terminal and a resistor mirror output terminal and having first, second, and third control terminals respectively coupled to the first, second, and third resistor control output terminals;

a feedback control circuit coupled to the first and second power supply terminals, and having first, second, and third control output terminals respectively coupled to the first, second, and third resistor control output terminals, a reference voltage input terminal, and a control input terminal coupled to the feedback node;

a first offset control circuit, having an output terminal coupled to the first resistor control output terminal, a first input terminal coupled to the first power supply terminal, and a second input terminal coupled to the second resistor control output terminal;

a second offset control circuit, having an output terminal coupled to the second resistor control output terminal, a first input terminal coupled to the first resistor control output terminal, and a second input terminal coupled to the third resistor control output terminal; and a third offset control circuit, having an output terminal coupled to the third resistor control output terminal, a first input terminal coupled to the second resistor control output terminal, and a second input terminal coupled to the second power supply terminal.

2. The resistor mirror of claim 1, wherein the reference voltage-controlled resistor circuit further comprises:

a first transistor having a drain coupled to the feedback node, a source coupled to the second power supply terminal, and a gate coupled to the first resistor control output terminal;

a second transistor having a drain coupled to the feedback node, a source coupled to the second power supply terminal, and a gate coupled to the second resistor control output terminal; and a third transistor having a drain coupled to the feedback node, a source coupled to the second power supply terminal, and a gate coupled to the third resistor control output terminal.

3. The resistor mirror of claim 1, wherein the second voltage-controlled resistor circuit further comprises:

a first transistor having a drain coupled to the resistor mirror output terminal, a source coupled to the second power supply terminal, and a gate coupled to the first resistor control terminal;

a second transistor having a drain coupled to the resistor mirror output terminal, a source coupled to the second power supply terminal, and a gate coupled to the second resistor control terminal; and a third transistor having a drain coupled to the resistor mirror output terminal, a source coupled to the second power supply terminal, and a gate coupled to the third resistor control terminal.

4. The resistor mirror of claim 1, wherein the feedback control circuit comprises:

a differential to single-ended amplifier having a non-inverting input coupled to an internal reference node, an inverting input coupled to the reference voltage input terminal, and an output coupled to a bias node;

a first transistor having a drain coupled to the internal reference node, a gate coupled to the bias node, and a source coupled to the first power supply terminal;

a second transistor having a drain coupled to the feedback node, a gate coupled to the bias node, and a source coupled to the first power supply terminal;

a reference resistor coupled between the internal reference node and the second power supply terminal; and a multi-output differential to single-ended amplifier having a non-inverting input coupled to the feedback node, an inverting input terminal coupled to the internal reference node, a first output terminal coupled to the first control output terminal, a second output terminal coupled to the second control output terminal, and a third output terminal coupled to the third control output terminal.

5. The resistor mirror of claim 4, wherein the differential to single-ended amplifier comprises:

a first transistor having a drain, a source coupled to the first power supply terminal, and a gate coupled to the second power supply terminal;

a second transistor having a drain, a source coupled to the drain of the first transistor, and a gate coupled to the reference voltage input terminal;

a third transistor having a drain, a source coupled to the drain of the first transistor, and a gate coupled to the internal reference node;

a fourth transistor having a gate and a drain coupled to the drain of the second transistor, and a source coupled to the second power supply terminal;

a fifth transistor having a gate and a drain coupled to the drain of the third transistor, and a source coupled to the second power supply terminal;

a sixth transistor having a drain, a gate coupled to the gate of the fourth transistor, and a source coupled to the second power supply terminal;

a seventh transistor having a gate and a drain coupled to the drain of the sixth transistor, and a source coupled to the first power supply terminal;

an eighth transistor having a drain coupled to the bias node, a source coupled to the first power supply terminal, and a gate coupled to gate of the seventh transistor; and a ninth transistor having a drain coupled to the bias node, a source coupled to the second power supply terminal, and a gate coupled to the gate of the fifth transistor.

6. The resistor mirror of claim 4, wherein the multi-output differential to single-ended amplifier comprises:

a first transistor having a drain, a source coupled to the first power supply terminal, and a gate coupled to the second power supply terminal;

a second transistor having a drain, a source coupled to the drain of the first transistor, and a gate coupled to the internal reference node;

a third transistor having a drain, a source coupled to the drain of the first transistor, and a gate coupled to the feedback node;

a fourth transistor having a gate and a drain coupled to the drain of the second transistor, and a source coupled to the second power supply terminal;

a fifth transistor having a gate and a drain coupled to the drain of the third transistor, and a source coupled to the second power supply terminal;

a sixth transistor having a drain, a gate coupled to the gate of the fourth transistor, and a source coupled to the second power supply terminal;

a seventh transistor having a gate and a drain coupled to the drain of the sixth transistor, and a source coupled to the first power supply terminal;

an eighth transistor having a drain coupled to the first resistor control output terminal, a source coupled to the first power supply terminal, and a gate coupled to gate of the seventh transistor;

a ninth transistor having a drain coupled to the first resistor control output terminal, a source coupled to the second power supply terminal, and a gate coupled to the gate of the fifth transistor;

a tenth transistor having a drain coupled to the second resistor control output terminal, a source coupled to the first power supply terminal, and a gate coupled to gate of the seventh transistor;

an eleventh transistor having a drain coupled to the second resistor control output terminal, a source coupled to the second power supply terminal, and a gate coupled to the gate of the fifth transistor;

a twelfth transistor having a drain coupled to the third resistor control output terminal, a source coupled to the first power supply, and a gate coupled to gate of the seventh transistor; and a thirteenth transistor having a drain coupled to the third resistor control output terminal, a source coupled to the second power supply terminal, and a gate coupled to the gate of the fifth transistor.

7. The resistor mirror of claim 1, wherein at least one of the first, second, or third offset control circuits comprises:

a first voltage-controlled current source coupled to the output terminal of the offset control circuit, the first input terminal of the offset control circuit, and the first and second power supply terminals; and a second voltage-controlled current source coupled to the output terminal of the offset control circuit, the second input terminal of the offset control circuit, and the first and second power supply terminals.

8. The resistor mirror of claim 7, wherein the first voltage-controlled current source further comprises:

a first transistor having a drain, a gate coupled to the first input terminal of the offset control circuit, and a source coupled to the first power supply terminal;

a second transistor having a gate and a drain coupled to the drain of the first transistor, and a source coupled to the second power supply terminal; and a third transistor having a drain coupled to the output terminal of the offset control circuit, a gate coupled to the gate of the second transistor, and a source coupled to the second power supply terminal.

9. The resistor mirror of claim 7, wherein the second voltage-controlled current source further comprises:

a first transistor having a drain, a gate coupled to the second input terminal of the offset control circuit, and a source coupled to the second power supply terminal;

a second transistor having a gate and a drain coupled to the drain of the first transistor, and a source coupled to the first power supply terminal; and a third transistor having a drain coupled to the output terminal of the offset control circuit, a gate coupled to the gate of the second transistor, and a source coupled to the first power supply terminal.

10. The resistor mirror of claim 1, further comprising:

a first loop filter capacitor coupled between the first resistor control output terminal and the second power supply terminal;

a second loop filter capacitor coupled between the second resistor control output terminal and the second power supply terminal; and a third loop filter capacitor coupled between the third resistor control output terminal and the second power supply terminal.

11. The resistor mirror of claim 10, wherein the first, second, and third loop filter capacitors each comprise a transistor having a drain and source coupled to the second power supply terminal and a gate coupled to the first, second, and third resistor control output terminals, respectively.

12. The resistor mirror of claim 10, wherein the resistance of the reference voltage-controlled resistor and of the resistance of the second voltage-controlled resistor are substantially in proportion to the resistance of the reference resistor.

13. A resistor mirror comprising:

a common terminal;

a plurality of resistor control output terminals;

a reference voltage-controlled resistor comprising a plurality of transistors coupled between a feedback node and the common terminal;

a second voltage-controlled resistor comprising a plurality of transistors coupled between a resistor mirror output terminal and the common terminal,;

means for conducting a first current through a reference resistor and a second current through the reference voltage-controlled resistor;

means for comparing the voltage across the reference resistor to the voltage across the reference voltage-controlled resistor;

means to control the voltage at each of the plurality of the resistor control output terminals so that the resistance of the reference voltage-controlled resistor and of the second voltage-controlled resistor is substantially in proportion to that of the reference resistor, where said means includes a feedback circuit; and means to control the voltage of each of the plurality of resistor control terminals such that, of the transistors of the reference voltage-controlled resistor, no more than one is biased in saturation, and of the transistors of the second voltage-controlled resistor, no more than one is biased in saturation, where said means includes the feedback circuit.

14. The resistor mirror of claim 13 wherein the transistors of the reference voltage-controlled each have a gate coupled to one of the plurality of resistor control output terminals.

15. The resistor mirror of claim 13 wherein the transistors of the second voltage-controlled resistor each have a gate coupled to one of the plurality of resistor control output terminals.

16. A method of inducing a reference device and an output device to exhibit a resistance in proportion to a resistance of an input device, the method comprising:

conducting a first current through the input device and a second current through the reference device, thereby generating a first voltage across the input device and a second voltage across the reference device; and adjusting a plurality of control signals coupled to the reference device and the output device so that the first and second voltages are substantially equal and so that a voltage generated across the output device is substantially in linear proportion to a current conducted through the output device.

* * * * *